United States Patent [19]

Thompson

[11] Patent Number: 4,833,512
[45] Date of Patent: May 23, 1989

[54] HETEROJUNCTION PHOTO-DETECTOR WITH TRANSPARENT GATE

[75] Inventor: George H. B. Thompson, Sawbridgeworth, Great Britain

[73] Assignee: ITT Gallium Arsenide Technology Center, a Division of ITT Corporation, Roanoke, Va.

[21] Appl. No.: 245,934

[22] Filed: Sep. 14, 1988

Related U.S. Application Data

[63] Continuation of Ser. No. 850,797, Apr. 11, 1986, abandoned.

[51] Int. Cl.$^4$ .................................................. H01L 29/80
[52] U.S. Cl. ....................................... 357/22; 357/30; 357/58; 357/16
[58] Field of Search ................ 357/22 B, 22 D, 22 A, 357/22 LA, 30 E, 30 I, 30 Q, 30 R, 30 D, 58, 16

[56] References Cited

U.S. PATENT DOCUMENTS

| | | | |
|---|---|---|---|
| 2,114,591 | 4/1938 | Clark | 357/30 Q X |
| 2,985,805 | 5/1961 | Nelson | 357/30 I X |
| 4,517,581 | 5/1985 | Thompson | 357/22 B X |
| 4,625,226 | 11/1986 | Antell | 357/30 E |
| 4,636,829 | 1/1987 | Greenwood et al. | 357/22 B X |
| 4,638,344 | 1/1987 | Cardwell, Jr. | 357/22 D X |

FOREIGN PATENT DOCUMENTS 2172742 9/1986 United Kingdom ............ 357/30 I X Primary Examiner—Andrew J. James
Assistant Examiner—William A. Mintel
Attorney, Agent, or Firm—Robert A. Walsh; Thomas N. Twomey; Mary C. Werner

[57] ABSTRACT

A photo-detector in the form of an optical field effect transistor comprising a semi-insulating InP substrate (1), a p+InP gate region (2) an n−InGaAs channel region (3) and source and drain contacts (5,6). Light incident on the bottom face of the substrate is detected. The channel region is thicker and reduced in doping in comparison with a normal JFET in order to achieve efficient light absorption and low gate to source capacitance. The source and drain contacts are interdigitated to increase the area for optical absorption (FIG. 1). Alternatively, (FIG. 2), the channel region is a composite structure including a lowly doped layer (11) for directing photogenerated carriers to a more highly doped layer (12) (active channel layer) of reduced dimensions of reduced area and upon which strip-like source and drain contacts (9,10) are disposed. The optical FET structures proposed facilitate integration with other circuit elements.

16 Claims, 2 Drawing Sheets

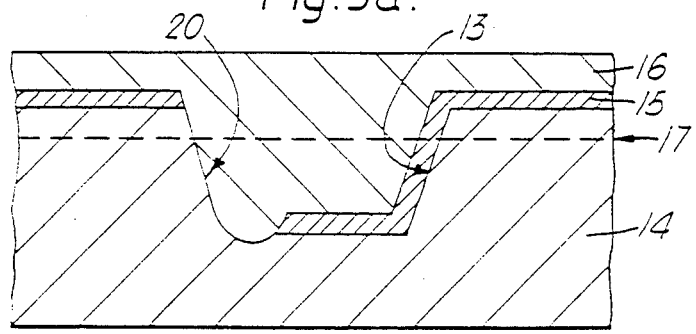
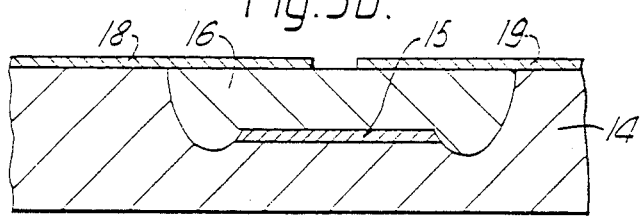
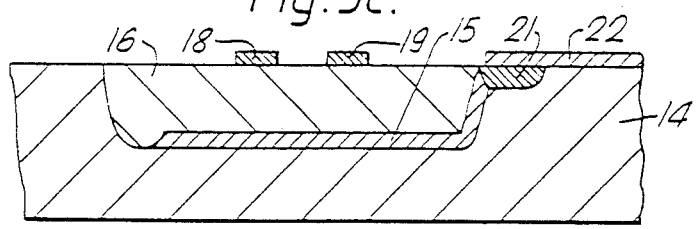

HETEROJUNCTION PHOTO-DETECTOR WITH TRANSPARENT GATE

This application is a continuation of application Ser. No. 850,797, filed Apr. 11, 1986, now abandoned.

This invention relates to photo-detectors and in particular, although not exclusively, to optical field effect transistors comprising photo-detectors suitable for operation in optical fibre systems. Typically photo-detections in such systems relies upon the use of avalanche photodiodes or upon the combination of a PIN diode and a FET transistor (PIN-FET combination) in which the output of the PIN diode is fed to the gate of an FET.

An optically sensitive FET can in principle combine the detector and amplifier functions of a PIN-FET and give superior sensitivity at a high modulation frequency as a result of elimination of the separate capacitance of the PIN diode. In practice the problem is to find a means of concentrating the light input on the small active area beneath the gate of the FET, and to ensure that it is all absorbed in the spacing of the channel.

According to one aspect of the present invention there is provided an optical field effect transistor comprising a semi-insulating optically transparent substrate, an optically transparent gate region of one conductivity type disposed on an area of one side of the substrate, a channel region of opposite conductivity type disposed on said gate region and source and drain contacts to said channel region, which transistor serves to detect light incident on the other side of the substrate in the vicinity of said area.

According to another aspect of the present invention there is provided a method of manufacturing an optical field effect transistor according to the preceding paragraph, the method including the steps of etching a recess in one side of a semi-insulating InP substrate, diffusing the one side of the substrate with Zn to form a p+InP layer on the substrate, growing n−InGaAs on the p+InP layer by liquid phase epitaxy whereby to fill the recess and produce a substantially planar structure, etching the n−InGaAs until the InP substrate is revealed outside of the filled recess, forming source and drain contacts to the n−InGaAs within the recess and isolating them from the p+InP layer within the filled recess, and providing a gate contact to the p+InP layer within the filled recess.

Embodiments of the present invention will now be described with reference to the accompanying drawings, in which.

A conventional compound semiconductor JFET basically comprises a semi-insulating substrate upon which is a relatively high conductivity channel layer. Source, drain and gate contacts are made to the channel layer from the same surface thereof. In such an arrangement when used as an optical FET there is little area available for absorption into the channel of light incident on the surface. In an alternative FET structure the gate is disposed under the channel layer and thus the depletion region extends towards the said surface rather than away from it. This alternative structure in theory provides a greater area for light absorption into the channel from said surface and such a structure has been proposed as an optical FET in "New minority hole sinked photoconductive detector" by C. Y. Chen et al. Appl.Phys.Lett. 43 (12) Dec. 15, 1983 p 115. The structure proposed therein has a spacing between the source and drain contacts of 4 μm and is of high capacitance in view of the large gate area. The spacing between the source and drain contacts should ideally be reduced to around 1 μm to reduce carrier transit time, to reduce the FET cut-off frequency and to reduce the FET noise contribution. However if the source drain contact spacing is so decreased in the known structure then once again there is little area for absorption into the channel of light incident on the surface.

One way of reducing the drain source spacing which we now propose is to use interdigitated source and drain electrodes to produce a nearly square active area and to illuminate the device from the substrate side. This is possible since InP used for the substrate, for example, is transparent. The total source to gate capacitance must not be allowed to increase or senstivity will again be prejudiced. To counteract the increase in area the thickness of the channel must be increased, and its doping level reduced, so that the gate may be sufficiently biased largely to deplete the channel. This increase in channel thickness is also very necessary to ensure substantially complete absorption of normally incident light.

Figure 1:
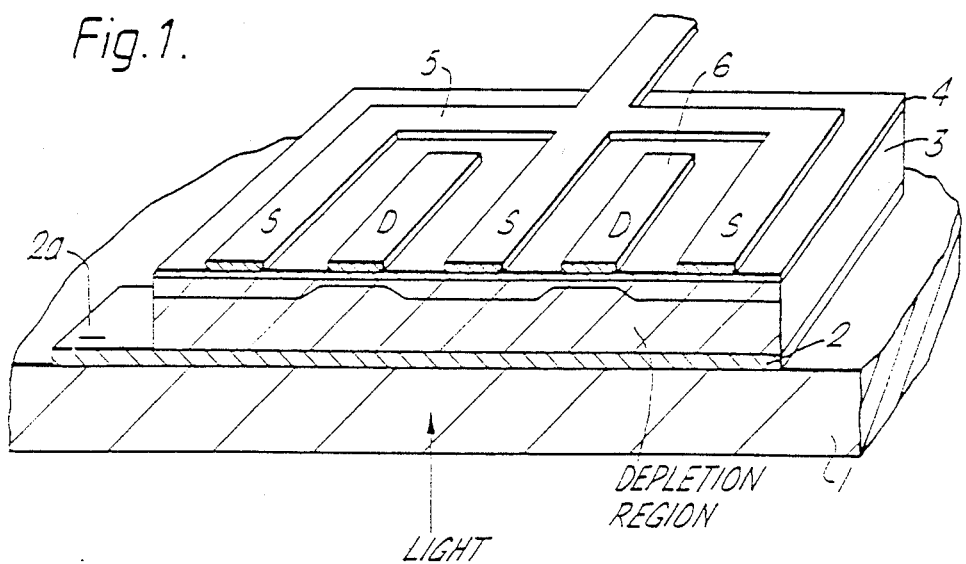
FIG. 1 illustrates a partially-sectioned view of one embodiment of optical FET.

These modifications produce an optical FET with unorthodox geometry and some unusual secondary characteristics. The source to drain spacing remains the same but instead of the channel thickness being about five times smaller than, it is about three times larger. Also the source and drain width is increased by a factor of ten to fifteen and the current per unit width has decreased in inverse proportion. Because of the low source current per unit width, the source and drain contacts can have very small dimensions in the direction of current flow in the channel and of the same order or even smaller than the source to drain spacing. If the gates were located in the conventional position between source and drain on top of the channel the fringe fields from adjacent gates in an interdigititated layout would then overlap as they spread across the thick channel under the source and drain contacts. Thus it is advantageous to dispense with the normal gates placed on top of the channel and substitute them by a continuous gate embedded below the channel. An example of such a structure is indicated in FIG. 1. The optical FET device of FIG. 1 comprises a semi-insulating InP substrate 1, a p+InP gate 2, an n−InGaAs channel layer 3, an optional p+InGaAs surface layer 4 and interdigitated source and drain contacts 5 and 6, respectively. The drain contacts are interconnected (not shown) in a manner similar to the interconnection of the source contacts. FIG. 1 only shows one half of the device. The gate is continuous under the whole channel area where light is absorbed and only extends from under the channel layer by an amount sufficient for electrical contact purposes, as at 2a. The embedded gate requires no self-alignment for its manufacture, as would multiple gates on top of the channel and it also reacts more strongly with the semiconductor underneath the source and drain contacts, adding a little more to the transconductance. Typically the doping levels and thicknesses of the layers 2 to 4 of FIG. 1 are as follows:

|  | Doping Level | Thickness |
| --- | --- | --- |
| Layer 2- | $2 \times 10^{18}$ cm$^{-3}$ | 0.5 μm |
| Layer 3- | $2 \times 10^{15}$ cm$^{-3}$ | 2 μm |
| Layer 4- | $5 \times 10^{17}$ cm$^{-3}$ | 700Å |

With a negatively biased gate and the drain being positively biased with respect to the source the depletion region is as shaded.

The structure of FIG. 1 can be converted into an opto-HEMT (High Electron Mobility Transistor) by using an n+ layer of higher bandgap than layer 3, eg InP, or InAlAs, and of appropriate thickness for layer 4. Layer 3 should be very low doped. The channel then consists of a two dimensional electron gas in the InGaAs layer 3 immediately below layer 4. This provides improved mobility. The source and drain contacts must then be sufficiently alloyed or suitably implanted to penetrate through layer 4 into layer 3.

Figure 2:
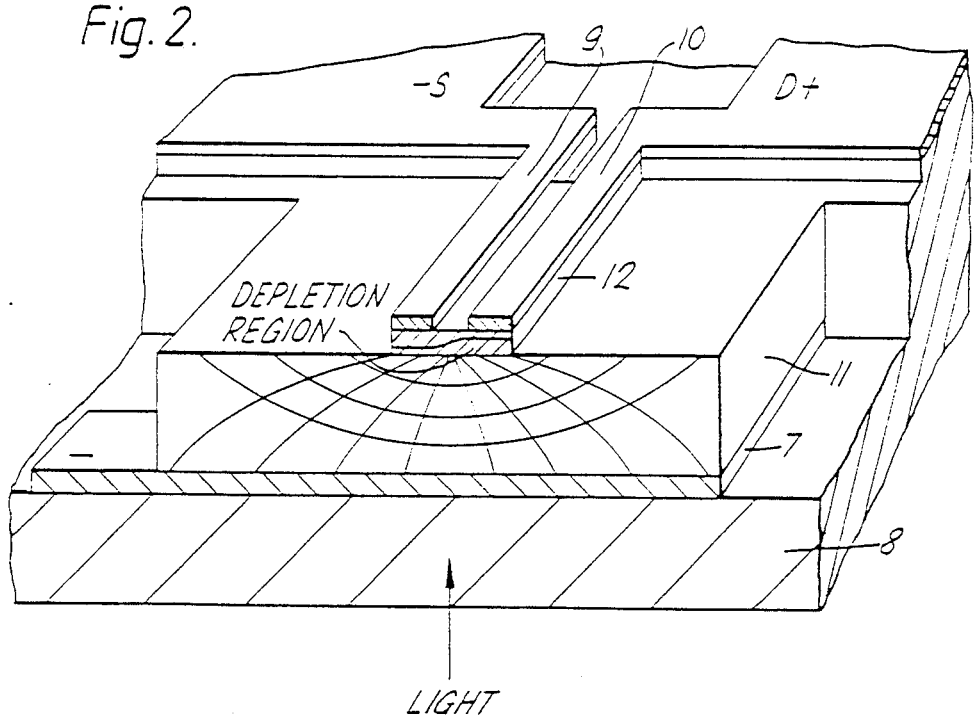
FIG. 2 illustrates a partially-sectioned view of another embodiment of optical FET, and FIGS. 3a, b and c illustrate stages in the manufacture of the device of FIG. 1.

FIG. 2 illustrates an alternative layout in which a wide embedded p+InP gate 7 disposed on a semi-insulating InP substrate 8 is associated with a non-interdigitated FET, having strip-like source and drain contacts 9 and 10, respectively, in such a way that carriers which are generated in the channel 11 over the whole area of the gate are focussed by the potential distribution into a smaller area strip-like channel layer 12. Thus the channel is comprised of two parts, the thick and very pure (n−−)InGaAs layer 11 immediately on top of the gate, and the thin and more highly doped (n)InGaAs layer 12 above it which is restricted in width to the combined dimensions of the source and drain and the spacing between them, the contacts being parallel to one another and the length of layer 12. Since the main space charge will be generated in layer 12 the field lines will follow the converging pattern between the gate and the channel layer 12 as illustrated and direct the photogenerated carriers towards the critical part (12) of the channel. This structure will have a somewhat lower capacitance than that in FIG. 1 but will demand better contacts because of the higher current density through the channel.

The structure of FIG. 2 can be converted into an opto-HEMT (High Electron Mobility Transistor) by substituting a thin layer of n+InP for the n InGaAs layer 12. The channel then consists of a two dimensional electron gas in the InGaAs layer 11 immediately below the InP. This provides improved mobility. Typically the doping levels and the thickness of the layers 7,11 and 12 of FIG. 2 are as follows:

|  | Doping Level | Thickness |
| --- | --- | --- |
| Layer 7 | $2 \times 10^{18}$ cm$^{-3}$ | 0.5 μm |
| Layer 11 | $5 \times 10^{14}$ cm$^{-3}$ | 3 μm |
| Layer 12 | $3 \times 10^{16}$ cm$^{-3}$ | 0.2 μm |

The fabrication of the devices may be based on the scheme illustrated in FIG. 3 to produce a planar geometry. Recesses 13 (FIG. 3a) are formed in a semi-insulating InP substrate 14, the surface of which is then zinc diffused to form a p+InP layer 15 part of which is ultimately the gate. The p+InP is removed on three sides 20 of the recess by appropriate masking with a resist and etching. Over the entire layer 15 n−InGaAs 16 is then grown by liquid phase epitaxy until a reasonably planar surface is obtained, and the recesses are filled. The wafer is then etched back with a non-selective etch until the semi-insulating substrate 14 is revealed outside of the recesses, that is to line 17, leaving localised regions of InGaAs line on the underside with p+InP. Interdigitated, in the case of FIG. 1, source and drain contacts 18,19 are registered on the InGaAs with metallic input connections carried over onto the semi-insulating InP (FIG. 3b). Finally appropriate contact 21 is made to the p+InP gate region 15 together with metallisation 22 (FIG. 3c, which is a section at right angles to FIG. 3b).

Both of the structures illustrated are appropriate for integrating monolithically with separate FET's formed on the insulating substrate and have low capacitance, thus rendering them appropriate for use in sensitive optical receivers. In the FIG. 2 structure the layers of n InGaAs used in the optical FET can also be used for the channel of separate JFET's and layers of n+InP and undoped GaInAs used in the optical HEMT can also be used for the channel of separate HEMT's. The optical FET of the present invention, which may be termed an optical embedded gate FET (OPEGFET), combines a number of features to produce a structure with low gate stray capacitance, these features being increase in the area for optical absorption, thickening of the channel layer with reduction in doping to more efficiently absorb the incident light whilst maintaining a low gate to source capacitance, and the embedding of a p-type gate layer beneath the channel layer, which gate layer is continuous over the whole area where light is absorbed, the device being illuminated at its substrate surface rather than its channel surface. In practice a load resistance in series with the gate is required, this may be readily manufactured by conventional techniques on the same substrate and electrically connected to the gate, that is integrally formed with the optical FET.

I claim:

1. An optical field effect transistor comprising a semi-insulating optically transparent substrate, an optically transparent gate region of one conductivity type disposed on an area of one side of the substrate, a channel region of opposite conductivity type disposed on said gate region and source and drain contacts to said channel region, which transistor serves to detect light incident on a second side of the substrate in the vicinity of said area.

2. An optical field effect transistor as claimed in claim 1 wherein said channel region has a thickness of more than about 2 μm and doping of less than about $2 \times 10^{15}$ cm$^{-3}$ and wherein the gate region is continuous over substantially the whole area where light is absorbed.

3. An optical field effect transistor as claimed in claim 1 wherein the source and drain contacts are interdigitated.

4. An optical field effect transistor as claimed in claim 3 wherein the substrate is of semi-insulating InP, the gate region is of p type InP and the channel region is of n type InGaAs.

5. An optical field effect transistor as claimed in claim 4 further including a p type InGaAs layer on the channel region and under the contacts.

6. An optical field effect transistor as claimed in claim 3, wherein the substrate is of semi-insulating InP, the gate region is of p type InP, the channel region is of n type InGaAs having a first dopant concentration and including an n+ layer having a second dopant concentration higher than said first dopant concentration on the channel region and under the contacts, said n+ layer selected from n+InP and n+InAlAs.

7. An optical field effect transistor as claimed in claim 1 wherein the channel region is a composite structure including a first layer disposed on said region and a second strip-shaped layer disposed on a portion of the first layer, the source and drain contacts comprising strip contacts disposed on the second strip-shaped layer in parallel with one another and in parallel with the length of the second strip-shaped layer, which first layer serves in use of the transistor to direct photogenerated carriers towards the second strip-shaped layer.

8. An optical field effect transistor as claimed in claim 7, wherein the substrate is of semi-insulating InP, the gate region is of p type InP, the first layer is of n type InGaAs and the second layer is of n type InGaAs.

9. An optical field effect transistor as claimed in claim 7, wherein the substrate is of semi-insulating InP, the gate region is of p type InP, the first layer is of n type InGaAs and the second layer is of n type InP.

10. An optical field effect transistor as claimed in claim 1 wherein, in use, the gate is negatively biased with respect to the source, and the drain is positively biased with respect to the source.

11. An optical field effect transistor comprising a semi-insulating optically transparent substrate having first and second opposed major surfaces, an optically transparent gate of one conductivity type disposed on an area of said first major surface, a channel of opposite conductivity type disposed on and substantially coextensive with said gate region and source and drain contacts to said channel region, which transistor serves to detect light incident on said second major surface of the substrate in the vicinity of said area.

12. An optical field effect transistor as claimed in claim 1, wherein said channel comprises:
a first light absorbing portion and a second portion;
said first light absorbing portion having a first dopant impurity concentration, said first light absorbing portion being separated from said source and drain contacts by said second portion; and
said second portion having a second dopant impurity concentration exceeding said first dopant impurity concentration by more than an order of magnitude.

13. An optical field effect transistor as claimed in claim 12 wherein said first dopant impurity concentration is about $5 \times 10^{14}$ cm$^{-3}$ and said second dopant impurity concentration is about $3 \times 10^{16}$ cm$^{-3}$.

14. An optical field effect transistor as claimed in claim 1 wherein said channel comprises a first part adjacent said gate having a first lateral expanse substantially covering said gate and a second part adjacent said source and drain and having a second lateral expanse smaller than said first lateral expanse, said second part having a higher dopant concentration than said first part.

15. An optical field effect transistor as claimed in claim 11 and further comprising:
a second layer of said one conductivity type disposed on said channel and beneath said source and drain contacts.

16. An optical field effect transistor as claimed in claim 1 further comprising:
a second layer of said one conductivity type on said channel and forming a P-N junction therewith over said area.

* * * * *